(12) United States Patent
Guillorn et al.

(10) Patent No.: US 9,093,379 B2
(45) Date of Patent: Jul. 28, 2015

(54) SILICIDATION BLOCKING PROCESS USING OPTICALLY SENSITIVE HSQ RESIST AND ORGANIC PLANARIZING LAYER

(71) Applicant: International Business Machines Corporation, Armonk, NY (US)

(72) Inventors: Michael A. Guillorn, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/904,744

(22) Filed: May 29, 2013

(65) Prior Publication Data
US 2014/0353825 A1 Dec. 4, 2014

(51) Int. Cl.
*H01L 21/285* (2006.01)
*H01L 21/8238* (2006.01)

(52) U.S. Cl.
CPC ... *H01L 21/28518* (2013.01); *H01L 21/823814* (2013.01); *H01L 21/823835* (2013.01)

(58) Field of Classification Search
CPC .............. H01L 31/18; H01L 27/14643; H01L 27/13689; H01L 21/28518; H01L 29/665
USPC ......... 438/581, 583, 630, 649, 651, 655, 664, 438/682, 57; 257/292, 382, 461, E21.165
See application file for complete search history.

(56) References Cited

U.S. PATENT DOCUMENTS

| | | | |
|---|---|---|---|
| 6,004,878 A * | 12/1999 | Thomas et al. ............... | 438/655 |
| 6,521,515 B1 | 2/2003 | Kluth | |
| 6,849,495 B2 * | 2/2005 | Wensley et al. ............... | 438/243 |
| 7,037,994 B2 | 5/2006 | Sugita et al. | |
| 7,060,577 B2 | 6/2006 | Lee et al. | |
| 7,244,549 B2 | 7/2007 | Iwasawa et al. | |
| 7,303,855 B2 * | 12/2007 | Hatakeyama et al. ..... | 430/270.1 |
| 7,358,025 B2 | 4/2008 | Hatakeyama | |

(Continued)

FOREIGN PATENT DOCUMENTS

JP    2011170207 A    9/2011

OTHER PUBLICATIONS

Van Delft et al. Hydrogen silsesquioxane/novolak bilayer resist for high aspect ratio nanoscale electron-beam lithography. Journal of Vacuum Science & Technology B, 18, 3419-3423 (2000), DOI:http://dx.doi.org/10.1116/1.1319682.*
English Abstract of JP2011170207A, filed by Hirobumi et al.; JEOL LTD., published Sep. 1, 2011.

*Primary Examiner* — Zandra Smith
*Assistant Examiner* — Lauren R Bell
(74) *Attorney, Agent, or Firm* — Louis J. Percello; Michael J. Chang, LLC

(57) ABSTRACT

A silicidation blocking process is provided. In one aspect, a silicidation method is provided. The method includes the following steps. A wafer is provided having a semiconductor layer over an oxide layer. An organic planarizing layer (OPL)-blocking structure is formed on one or more regions of the semiconductor layer which will block the one or more regions of the semiconductor layer from silicidation. At least one silicide metal is deposited on the wafer. The wafer is annealed to react the at least one silicide metal with one or more exposed regions of the semiconductor layer. Unreacted silicide metal is removed. Any remaining portions of the OPL-blocking structure are removed.

15 Claims, 3 Drawing Sheets

(56) References Cited

U.S. PATENT DOCUMENTS

| | | |
|---|---|---|
| 7,846,850 B2 | 12/2010 | Yoon |
| 7,897,425 B2 * | 3/2011 | Baek et al. .................... 438/57 |
| 7,947,585 B2 | 5/2011 | Baek et al. |
| 8,063,393 B2 | 11/2011 | Chen |
| 2002/0022348 A1 * | 2/2002 | Sakaguchi et al. ............ 438/480 |
| 2006/0284223 A1 * | 12/2006 | Kim .............................. 257/292 |
| 2011/0193189 A1 * | 8/2011 | Choi ............................. 257/506 |

* cited by examiner

SILICIDATION BLOCKING PROCESS USING OPTICALLY SENSITIVE HSQ RESIST AND ORGANIC PLANARIZING LAYER

FIELD OF THE INVENTION

The present invention relates to a silicidation blocking process and more particularly, to techniques for using optically sensitive hydrogen silsesquioxane (HSQ) or an oxide hardmask and an organic planarization layer (OPL) to define the region to silicide.

BACKGROUND OF THE INVENTION

In several complementary metal-oxide semiconductor (CMOS) device applications, having an unsilicided silicon region (i.e., a diffusion doped resistor) or a bare silicon region without silicide (i.e., a photodetector application) is needed. In conventional approaches, silicon nitride (SiN) is often used as an optical lithographically defined hard mask. Regions with the nitride hard mask block silicidation from occurring and the electrical resistance in these regions is set by the doping level (i.e., in diffusion doped resistors).

However, the hard mask (e.g., SiN) is always left behind in such conventional flows, as removing it would also tend to roughen and remove doped silicon. In an application requiring other, or no, stacks above the silicon (i.e., photodetectors especially), this presents a problem.

Therefore, improved techniques for defining areas for silicidation in CMOS device applications would be desirable.

SUMMARY OF THE INVENTION

The present invention relates to a silicidation blocking process. In one aspect of the invention, a silicidation method is provided. The method includes the following steps. A wafer is provided having a semiconductor layer over an oxide layer. An organic planarizing layer (OPL)-blocking structure is formed on one or more regions of the semiconductor layer which will block the one or more regions of the semiconductor layer from silicidation. At least one silicide metal is deposited on the wafer. The wafer is annealed to react the at least one silicide metal with one or more exposed regions of the semiconductor layer. Unreacted silicide metal is removed. Any remaining portions of the OPL-blocking structure are removed.

In another aspect of the invention, a device structure is provided. The device structure includes a wafer having a semiconductor layer over an oxide layer wherein one or more first regions of the semiconductor layer include a silicide and one or more second regions of the semiconductor layer are unsilicided and exposed, and wherein the one or more second regions of the semiconductor layer have a surface roughness of from about 0.1 nanometers (nm) to about 0.5 nm.

A more complete understanding of the present invention, as well as further features and advantages of the present invention, will be obtained by reference to the following detailed description and drawings.

DETAILED DESCRIPTION OF PREFERRED EMBODIMENTS

Provided herein is a silicidation blocking process that employs optically sensitive hydrogen silsesquioxane (HSQ) and an organic planarization layer (OPL) to define the region to silicide. In the present process flow, no hard mask will be left on top of the unsilicided silicon regions, thus avoiding the above-described problems associated with conventional silicidation techniques.

Figure 1:
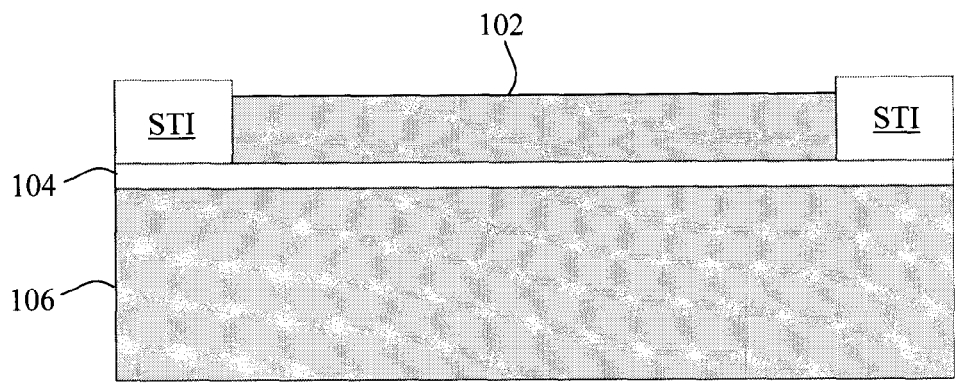
FIG. 1 is a cross-sectional diagram illustrating an exemplary starting platform for a silicidation process including a semiconductor layer separated from a substrate by an oxide layer according to an embodiment of the present invention.
Figure 2:
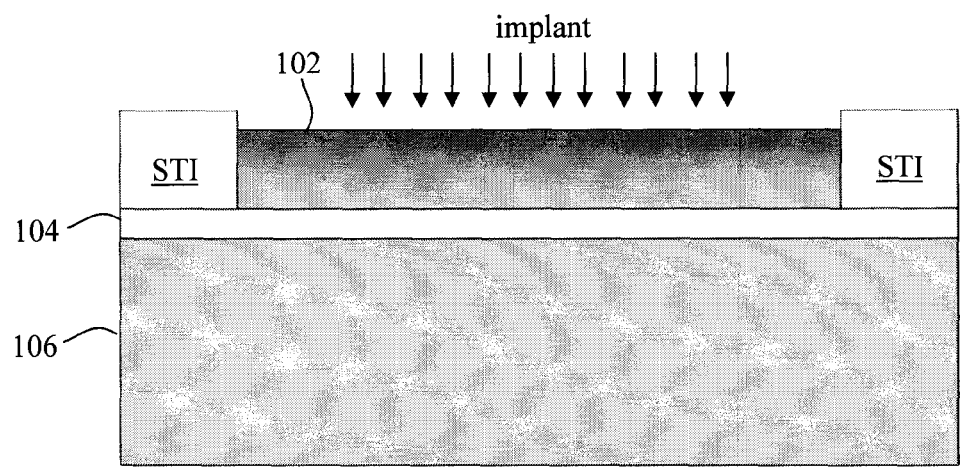
FIG. 2 is a cross-sectional diagram illustrating an implant being performed into the semiconductor layer according to an embodiment of the present invention.

The present techniques will now be described by way of reference to FIGS. 1-8. As shown in FIG. 1, the starting platform is either a patterned silicon-on-insulator (SOI) or bulk semiconductor (e.g., silicon (Si), germanium (Ge), or silicon geranium (SiGe)) wafer. A SOI wafer includes a SOI layer separated from a substrate (e.g., a Si substrate) by a buried oxide or BOX. A similar configuration can be achieved in a bulk semiconductor wafer, for example, using an oxygen implant.

Whichever type of wafer is employed (SOI or bulk), the starting structure will include a semiconductor layer 102 separated from a substrate 106 by an oxide layer 104. See FIG. 1. Next, shallow trench isolation (STI) is performed to isolate one or more active areas of the wafer. STI involves common lithography and etching processes which are well known to those of skill in the art.

Next, an implant is performed into the semiconductor layer 102 in the active region. See FIG. 2. Of course, the particular dopant(s) implanted at this step are dependent on the device being fabricated. By way of example only, an n-type or p-type dopant may be implanted into the semiconductor layer 102. For example, phosphorous (P) or arsenic (As) are typical n-type dopants and boron (B) is a typical p-type dopant. Dopant concentrations of from about $1 \times 10^{19}$ atoms per cubic centimeter (atoms/cm$^3$) to about $1 \times 10^{22}$ atoms/cm$^3$ may be employed.

An anneal, for example, a rapid thermal anneal (RTA), spike anneal and/or laser anneal process, may be performed to diffuse and activate the implanted dopants. Temperatures for this anneal may range from about 900° C. to about 1,100° C., and the anneal may vary in duration from a few milliseconds (ms), for example five ms, to a few seconds, for example, five seconds. In an exemplary scenario wherein the present techniques are being used to fabricate a diffusion doped resistor for instance, this implantation step can be performed to set the resistivity of the device.

Figure 3:
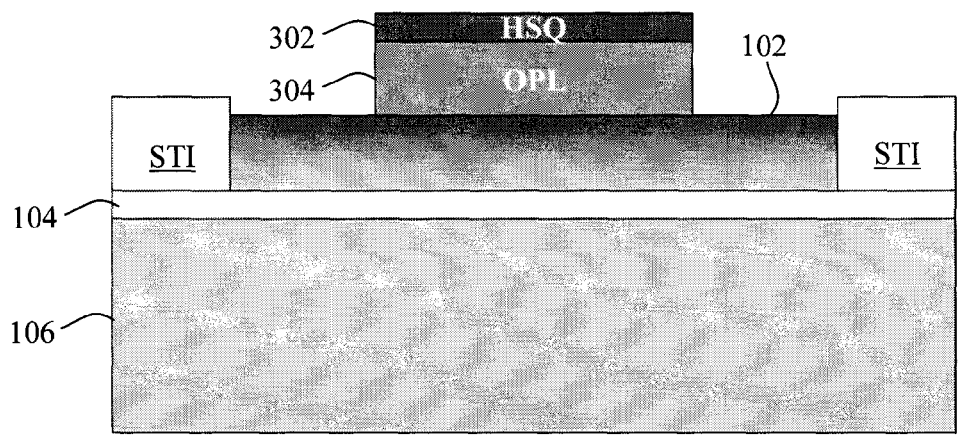
FIG. 3 is a cross-sectional diagram illustrating an organic planarizing layer (OPL)/hydrogen silsesquioxane (HSQ) stack (also referred to herein as an OPL-blocking structure) having been formed on a region of the semiconductor layer which will be blocked from silicidation according to an embodiment of the present invention.

Next, as shown in FIG. 3, an OPL/HSQ stack is formed on the wafer, i.e., on a region of the semiconductor layer 102 which will be blocked from silicidation. According to an exemplary embodiment, this OPL/HSQ stack is formed on the wafer by first blanket depositing an OPL on the wafer using, for example, a spin-coating process.

According to an exemplary embodiment, the OPL contains an aromatic cross-linkable polymer (e.g., naphthalene-based) in a solvent and is coated onto the substrate 102 to a thickness of from about 30 nanometers (nm) to about 300 nm. Spin-coating ensures that the organic planarizing layer sufficiently fills any gaps/surface roughness in the semiconductor layer 102.

Other suitable materials for use in the OPL include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference herein. A post-apply bake is then performed to cross-link the organic planarizing layer and bake off the solvent. According to an exemplary embodiment, the post-apply bake is conducted at a temperature of up to about 250 degrees Celsius (° C.), e.g., from about 200° C. to about 250° C.

An HSQ layer is blanket deposited onto the OPL, e.g., again using a spin-coating process. The HSQ layer is then patterned by first exposing portions of the HSQ layer (i.e., the portions of the HSQ layer that will remain after the patterning) to an energy-yielding process that will cure and cross-link those portions of the HSQ layer. According to an exemplary embodiment, the HSQ layer is cross-linked by exposing the HSQ layer to e-beam or extreme ultraviolet (EUV) radiation with wavelengths shorter than 157 nanometers (nm). This serves to cross-link the HSQ layer in the exposed area(s).

Next, unexposed portions of the HSQ layer (i.e., those portions which are not cross-linked by the above-described process) can then be selectively removed using a developer wash (such as a Tetramethyl-ammonium hydroxide (TMAH) based developer or a salt based developer such as an aqueous mixture of sodium hydroxide (NaOH) alkali and sodium chloride (NaCl) salt) resulting in patterned HSQ 302. See FIG. 3. Since cross-linking is used herein to pattern the HSQ layer, the term "patterned HSQ" as used herein also implies that these patterned portions of the HSQ layer are cross-linked.

Following the developer wash, the remaining patterned HSQ 302 may be annealed to further increase the density of the HSQ. According to an exemplary embodiment, the anneal is performed at a temperature of from about 500° C. to about 900° C. for a duration of from about 5 minutes to about 30 minutes. See also, U.S. patent application Ser. No. 13/344, 352 filed by Cohen et al., entitled "Compressive (PFET) and Tensile (NFET) Channel Strain in Nanowire FETs Fabricated with a Replacement Gate Process."

The patterned HSQ 302 can then be used as a mask to pattern the OPL, using for example a plasma ashing process with ammonia or oxygen as the reactive species, resulting in patterned OPL 304. The patterned HSQ 302 and patterned OPL 304 form the OPL/HSQ stack on the wafer which, as described above, will block a region(s) of the semiconductor layer 102 from silicidation.

Alternatively, rather than using a (patterned) HSQ to pattern the OPL, a tri-layer patterning process might instead be employed. See FIG. 4. For instance, the OPL may be deposited on the wafer in the same manner as described in conjunction with the description of FIG. 3, above. An oxide layer (e.g., a low temperature oxide) is deposited on the OPL. An organic photoresist is then patterned on the oxide layer (with the footprint and location of the OPL/oxide stack over the wafer)—see below. The OPL/oxide hardmask have alternating selectivity towards fluorine- and oxygen-containing reactive ion etching (RIE) chemistry and therefore allow for highly selective pattern transfer from the organic photoresist pattern into the OPL. Further, the OPL/oxide or combination is important for reflectivity control in high numerical aperture (NA) optical lithography applications.

As highlighted above, the organic photoresist is deposited onto the oxide layer and patterned to form patterned photoresist 402. The organic photoresist may be patterned using electron-beam (e-beam) lithography (EBL), nanoimprint lithography, extreme ultraviolet lithography (EUVL), or at 193 nm wavelength. Thus the term "photoresist," as used herein broadly encompasses any resist material(s) that can be patterned using EBL, EUVL and/or at 193 nm wavelength, or any other suitable materials. According to an exemplary embodiment, the organic photoresist (e.g., an aliphatic or aromatic resist) is spin-coated onto the oxide hardmask.

Figure 4:
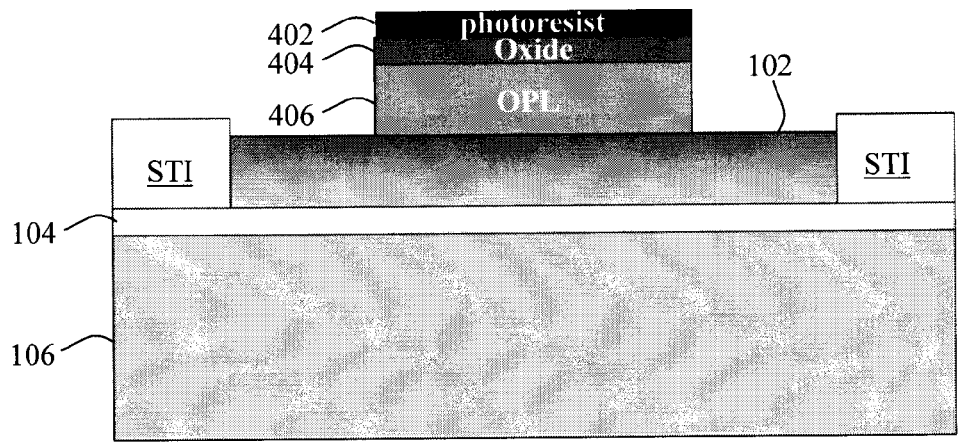
FIG. 4 is a cross-sectional diagram illustrating an alternate embodiment wherein OPL/oxide stack (also referred to herein as an OPL-blocking structure) has been formed on a region of the semiconductor layer which will be blocked from silicidation according to an embodiment of the present invention.

A two-step RIE process through the patterned organic photoresist 402 is then used to pattern the oxide layer and the OPL, resulting in patterned oxide hardmask 404 and patterned OPL 406, respectively. The first RIE step is selective for etching the oxide hardmask (using the patterned organic photoresist 402). According to an exemplary embodiment, the first RIE step is performed using a fluorine-containing, e.g., $CHF_3/CF_4$ chemistry. The second RIE step is selective for etching the OPL. According to an exemplary embodiment, the second RIE step is performed using an oxygen-containing, e.g., $N_2/O_2$ chemistry. For clarity of depicting the tri-layer patterning process, the patterned organic photoresist 402 is shown in FIG. 4. However, it is preferable that the patterned organic photoresist 402 is removed during this two-step RIE process. Namely, the fluorine-containing, e.g., $CHF_3/CF_4$, etch partially etches the resist, and any residual resist is removed by the oxygen-containing, e.g., $N_2/O_2$, etch.

The result is an OPL/oxide stack over the wafer. As above, the OPL/oxide stack will block a region(s) of the semiconductor layer 102 from silicidation.

Whichever above-described silicidation blocking procedure is employed (i.e., OPL/HSQ stack or OPL/oxide stack, the remainder of the process remains the same. Any details specific to the particular blocking structure used (for example when the blocking structure is to be removed post silicidation) will be highlighted below. For ease of reference, the blocking structure will be referred to generically herein as "OPL-blocking structure 502" (see below).

Figure 5:
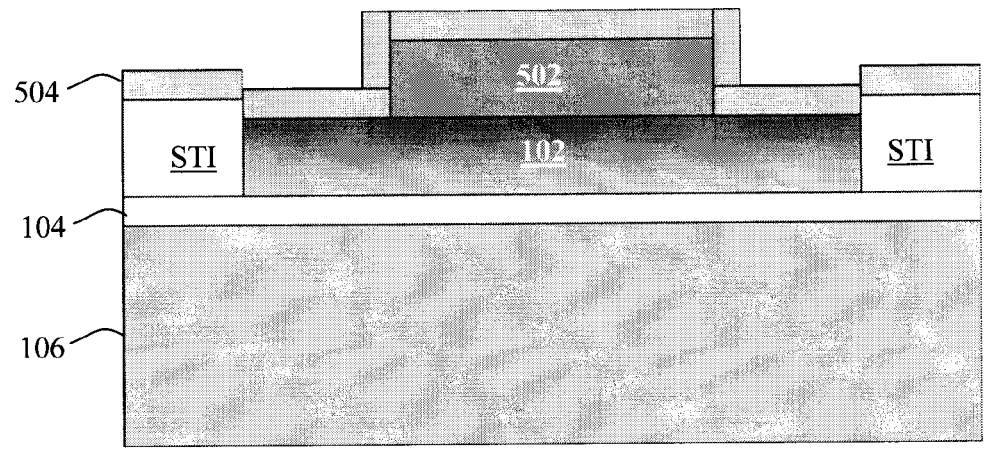
FIG. 5 is a cross-sectional diagram illustrating a silicide metal(s) having been blanket deposited onto the wafer according to an embodiment of the present invention.

As shown in FIG. 5, a silicide metal(s) 504 is blanket deposited onto the wafer (i.e., onto the areas of exposed semiconductor that will be silicided as well as on the areas blocked from silicidation by the OPL-blocking structure 502). Suitable silicide metals include, but are not limited to, nickel (Ni), titanium (Ti), cobalt (Co), tungsten (W) and/or combinations including at least one of the foregoing metals, deposited, for example, using a process such as chemical vapor deposition (CVD) or atomic layer deposition (ALD). It is notable that in the exemplary scenario involving an OPL/oxide stack (FIG. 4), it is preferable to first remove the patterned oxide hardmask 404 prior to depositing the silicide metal(s) 504. Thus in that case, the OPL-blocking structure 502 would include only the patterned OPL. By contrast, in the case of an OPL/HSQ stack, the OPL-blocking structure 502 would include both the patterned OPL and HSQ.

Figure 6:
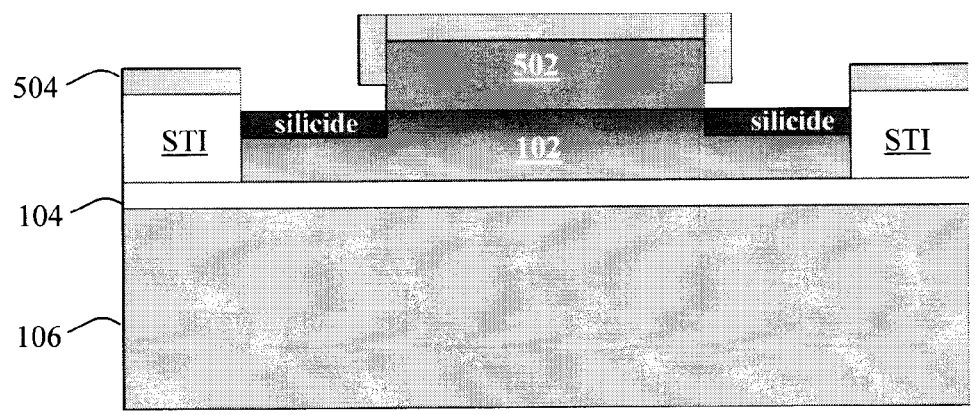
FIG. 6 is a cross-sectional diagram illustrating the wafer having been annealed to react the deposited silicide metal(s) with exposed areas of the semiconductor layer to form a silicide in those areas according to an embodiment of the present invention.
Figure 7:
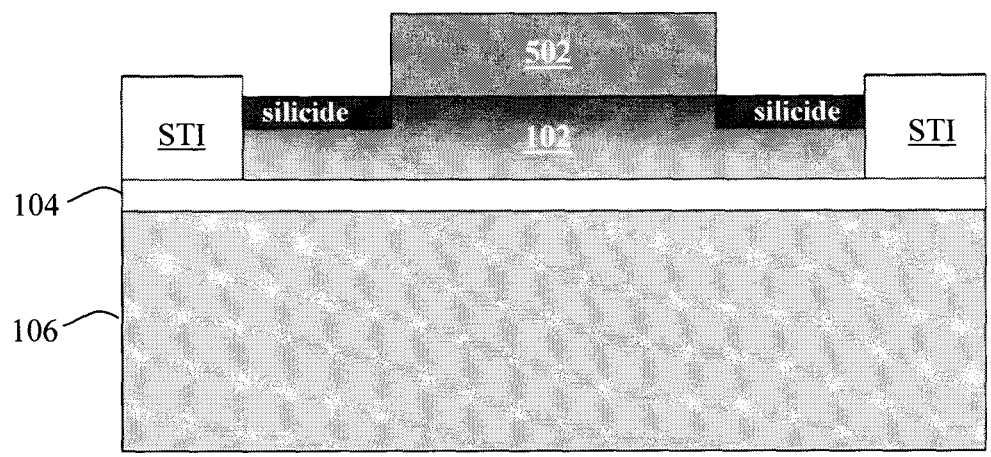
FIG. 7 is a cross-sectional diagram illustrating unreacted silicide metal(s) having been stripped according to an embodiment of the present invention.

As shown in FIG. 6, the wafer is then annealed to react the deposited silicide metal(s) with exposed areas/regions of semiconductor layer 102 to form a silicide in those areas. The term "silicide" is being used herein generally to refer to the product of reacting a semiconductor with a metal(s). Thus, for example, even when the semiconductor contains elements other than silicon, such as silicon-germanium or even just germanium alone, for clarity and consistency of description the metal-semiconductor product is referred to herein as a silicide. As such, materials which are also referred to in the art as germanosilicides, germanides, etc. are all generically referred to herein as "silicides." The areas blocked by the OPL-blocking structure 502 and/or by the STI regions will not be silicided in this process. According to an exemplary embodiment, this silicidation anneal is performed at a temperature of from about 300° C. to about 550° C., for a duration of from about 10 seconds to about 120 seconds.

It is notable that in conventional processes the masking employed to block areas of the device from silicidation would likely remain in place since removing conventional masks (using for example an etching process) would roughen and remove the underlying device material. A roughened device surface is especially unfavorable in the case of photodetector devices, where surface roughness contributes to recombination centers that lower the efficiency of the photodetector.

With the present techniques, however, as will be described in detail below the OPL-blocking structure 502 can be removed easily and without damaging the underlying device surface. The result thus will be one or more regions of the semiconductor layer which are silicided, and one or more regions of the semiconductor layer 102 which are unsilicided, unmasked (exposed) and smooth. The smoothness of the unsilicided regions of the semiconductor layer 102 will be described in detail in conjunction with the description of FIG. 8, below.

Specifically, first, the unreacted silicide metal(s) 504 is stripped/removed. See FIG. 7. The present silicidation process is thus a self-aligned process (also referred to as a salicide) since the silicidation will only occur in the areas of exposed semiconductor. The unreacted metal can be removed, for example, using an etching or grinding process, leaving the salicide in place. It is notable that the process of removing the unreacted silicide metal(s) may also serve to remove some, or all, of the OPL-blocking structure 502. If all of the OPL-blocking structure 502 is removed during the unreacted metal etch, then the present silicidation process may be considered complete at this point. However, if at least a portion of the OPL-blocking structure 502 remains, it may be desirable to remove it. See FIG. 8.

The manner by which the OPL-blocking structure 502 is removed depends on the particular blocking stack employed. Based on the description above, when an OPL/HSQ stack is present, then at this stage in the process, there may still be a layer of patterned HSQ present over a layer patterned OPL that is to be removed. The patterned HSQ layer can be removed using a diluted hydrofluoric (DHF) etch. According to an exemplary embodiment, the etching includes dipping the wafer in 100:1 diluted HF (DHF) (the dilution is done with water ($H_2O$)) for 60 seconds. Following removal of the patterned HSQ layer, the patterned OPL can be removed using a plasma ashing process—see above.

By contrast, when an OPL/oxide hardmask blocking structure was employed, as described above the oxide hardmask has already been stripped. Any patterned OPL that remains after the metal etch can now be removed—again using a suitable plasma ashing process.

Figure 8:
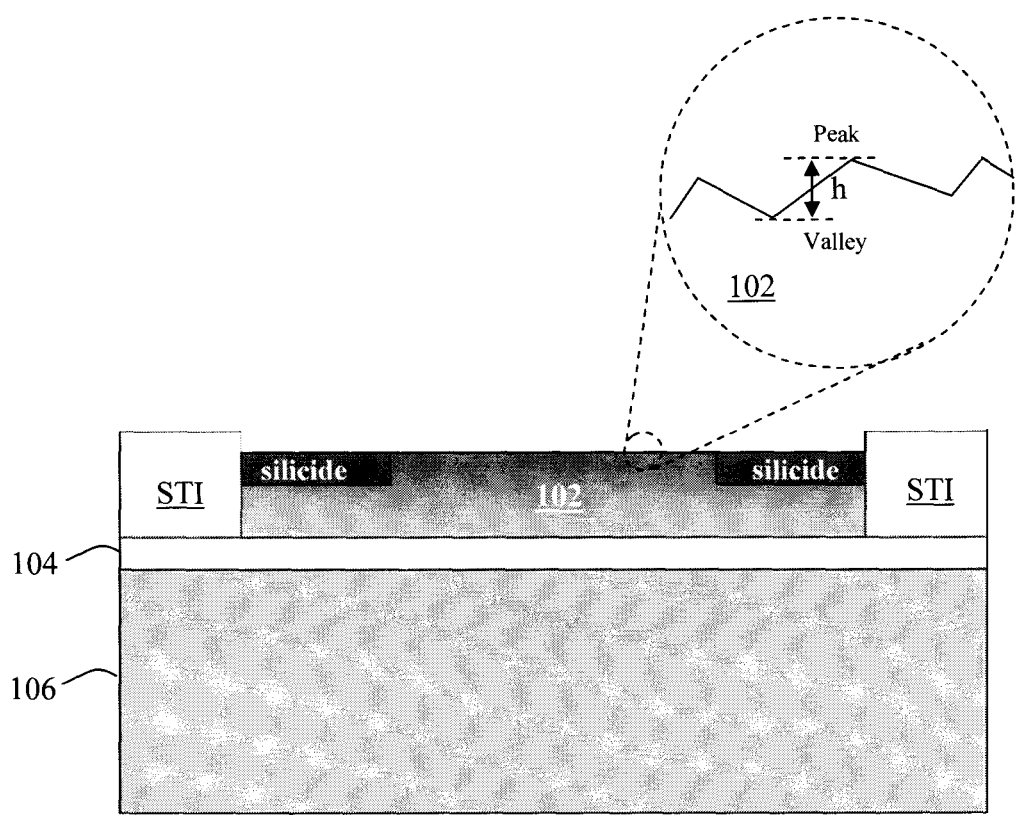
FIG. 8 is a cross-sectional diagram illustrating the OPL-blocking structure having been removed according to an embodiment of the present invention.

As described above, by way of the present techniques, the regions of the semiconductor layer 102 which remain unsilicided are smooth. The smoothness of a surface may be quantified based on a roughness factor. As shown in FIG. 8, the surface of the unsilicided regions of the semiconductor layer 102, at a microscopic level (as depicted in the magnified view) are not perfectly smooth. The roughness at the surface is made up of a plurality of peaks and valleys. According to an exemplary embodiment, the surface roughness is quantified based on an average height h between the peaks and valleys which according to the present techniques is less than about 1.0 nanometers (nm), for example, from about 0.1 nm to about 0.5 nm, e.g., 0.1 nm to about 0.3 nm, and that is considered herein to be a smooth surface. For further description of the use of a roughness factor, see for example U.S. Pat. No. 6,521,515 issued to Kluth, entitled "Deeply Doped Source/Drains for Reduction of Silicide/Silicon interface Roughness," the contents of which are incorporated by reference herein—which describes methods for quantifying interface roughness.

Any further processing steps known in the art to complete the particular device structure(s) being fabricated may now be performed. The given final processing steps of course will vary depending on the particular devices at hand, and would be known to those of skill in the art.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A silicidation method, comprising the steps of:
providing a wafer having a semiconductor layer over an oxide layer;
forming an organic planarizing layer (OPL)-blocking structure directly on one or more regions of the semiconductor layer which will block the one or more regions of the semiconductor layer from the silicidation, wherein the OPL-blocking structure comprises a patterned OPL in direct contact with the semiconductor layer, and a patterned hydrogen silsesquioxane (HSQ) layer directly on the patterned OPL;
depositing at least one silicide metal on the wafer;
annealing the wafer to react the at least one silicide metal with one or more exposed regions of the semiconductor layer;
removing unreacted silicide metal following the anneal; and
removing any remaining portions of the OPL-blocking structure following the removal of the unreacted silicide metal by first removing the patterned HSQ, and then removing the patterned OPL.

2. The method of claim 1, further comprising the step of:
isolating one or more active areas in the wafer using shallow trench isolation.

3. The method of claim 1, further comprising the step of:
implanting one or more dopants into the semiconductor layer.

4. The method of claim 3, wherein the dopants comprise n-type dopants or p-type dopants.

5. The method of claim 1, further comprising the steps of:
depositing an OPL on the wafer;
depositing an HSQ layer on the OPL;
patterning the HSQ layer to form the patterned HSQ layer; and
patterning the OPL using the patterned HSQ layer as a mask to form the patterned OPL.

6. The method of claim 5, wherein the OPL is deposited on the wafer using a spin-coating process.

7. The method of claim 5, wherein the OPL comprises an aromatic cross-linkable polymer.

8. The method of claim 5, wherein the step of patterning the HSQ layer comprises the steps of:
using e-beam or extreme ultraviolet (EUV) radiation to cross-link the HSQ layer in exposed areas;
removing unexposed portions of the HSQ layer to form the patterned HSQ layer; and
annealing the patterned HSQ layer.

9. The method of claim 8, wherein the unexposed portions of the HSQ layer are removed using Tetramethyl-ammonium hydroxide (TMAH).

10. The method of claim 5, wherein the OPL is patterned using a plasma ashing process.

11. The method of claim 1, wherein the at least one silicide metal is selected from the group consisting of nickel, titanium, cobalt, tungsten, and combinations comprising at least one of the foregoing metals.

12. The method of claim 1, wherein the at least one silicide metal is deposited on the wafer using chemical vapor deposition or atomic layer deposition.

13. The method of claim 1, wherein removing the remaining portions of the OPL-blocking structure following the removal of the unreacted silicide metal comprises first removing the patterned HSQ layer using a diluted hydrofluoric (DHF) etch, and then removing the patterned OPL using a plasma ashing process.

14. The method of claim 1, wherein the one or more regions of the semiconductor layer which are blocked from the silicidation following the removal of the remaining portions of the OPL-blocking structure have a surface roughness of from about 0.1 nm to about 0.5 nm.

15. The method of claim 1, wherein the unreacted silicide metal is removed following the anneal using an etching or grinding process.

* * * * *